United States Patent
Lee et al.

(10) Patent No.: US 8,252,675 B2
(45) Date of Patent: Aug. 28, 2012

(54) METHODS OF FORMING CMOS TRANSISTORS WITH HIGH CONDUCTIVITY GATE ELECTRODES

(75) Inventors: Jongwon Lee, Hwaseong-si (KR); Boun Yoon, Seoul (KR); Sang Yeob Han, Anyang-si (KR); Chae Lyoung Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/942,763

(22) Filed: Nov. 9, 2010

(65) Prior Publication Data
US 2011/0136313 A1 Jun. 9, 2011

(30) Foreign Application Priority Data
Dec. 8, 2009 (KR) ........................ 10-2009-0121108

(51) Int. Cl.
*H01L 21/336* (2006.01)
*H01L 21/44* (2006.01)
*H01L 21/88* (2006.01)
*H01L 21/4763* (2006.01)

(52) U.S. Cl. ........ 438/592; 438/299; 438/637; 438/926; 438/183; 257/E21.177; 257/E21.621; 257/E21.626; 257/E21.64

(58) Field of Classification Search .................... 438/296
See application file for complete search history.

(56) References Cited

U.S. PATENT DOCUMENTS

| 6,130,123 A | 10/2000 | Liang et al. |
| 6,166,417 A | 12/2000 | Bai et al. |
| 6,265,258 B1 | 7/2001 | Liang et al. |
| 6,373,111 B1 | 4/2002 | Zheng et al. |
| 6,492,217 B1 | 12/2002 | Bai et al. |

(Continued)

FOREIGN PATENT DOCUMENTS

| JP | 2002-329794 | 11/2002 |
| JP | 2005-197748 | 7/2005 |
| JP | 2006-351580 | 12/2006 |
| KR | 1020020075732 A | 10/2002 |
| KR | 1020050073541 A | 7/2005 |
| KR | 1020060129959 A | 12/2006 |

OTHER PUBLICATIONS

Steigerwald, Joseph M., "Chemical Mechanical Polish: The Enabling Technology," 2008 IEEE, pp. 37-40.

*Primary Examiner* — Fernando L Toledo
*Assistant Examiner* — Valerie N Brown
(74) *Attorney, Agent, or Firm* — Myers Bigel Sibley & Sajovec, P.A.

(57) ABSTRACT

Provided is a method for manufacturing a MOS transistor. The method comprises providing a substrate having a first active region and a second active region; forming a dummy gate stack on the first active region and the second active region, the dummy gate stack comprising a gate dielectric layer and a dummy gate electrode; forming source/drain regions in the first active region and the second active region disposed at both sides of the dummy gate stack; forming a mold insulating layer on the source/drain region; removing the dummy gate electrode on the first active region to form a first trench on the mold insulating layer; forming a first metal pattern to form a second trench at a lower portion of the first trench, and removing the dummy gate electrode on the second active region to from a third trench on the mold insulating layer; and forming a second metal layer in the second trench and the third trench to form a first gate electrode on the first active region and a second gate electrode on the second active region.

15 Claims, 19 Drawing Sheets

U.S. PATENT DOCUMENTS

| | | | |
|---|---|---|---|
| 6,573,134 B2 | 6/2003 | Ma et al. | |
| 6,620,713 B2 | 9/2003 | Arghavani et al. | |
| 6,696,333 B1 | 2/2004 | Zheng et al. | |
| 6,696,345 B2 | 2/2004 | Chau et al. | |
| 6,709,911 B1 | 3/2004 | Doczy et al. | |
| 6,743,683 B2 | 6/2004 | Barns et al. | |
| 6,790,731 B2 | 9/2004 | Zheng et al. | |
| 6,794,232 B2 | 9/2004 | Zheng et al. | |
| 6,806,146 B1 | 10/2004 | Brask et al. | |
| 6,809,017 B2 | 10/2004 | Arghavani et al. | |
| 6,825,506 B2 | 11/2004 | Chau et al. | |
| 6,849,509 B2 | 2/2005 | Barnak et al. | |
| 6,867,102 B2 | 3/2005 | Brask et al. | |
| 6,879,009 B2 | 4/2005 | Zheng et al. | |
| 6,890,807 B2 | 5/2005 | Chau et al. | |
| 6,893,927 B1 | 5/2005 | Shah et al. | |
| 6,939,815 B2 | 9/2005 | Brask et al. | |
| 6,974,764 B2 | 12/2005 | Brask et al. | |
| 6,998,686 B2 | 2/2006 | Chau et al. | |
| 7,022,559 B2 | 4/2006 | Barnak et al. | |
| 7,030,430 B2 | 4/2006 | Doczy et al. | |
| 7,037,845 B2 | 5/2006 | Brask et al. | |
| 7,056,794 B2 | 6/2006 | Ku et al. | |
| 7,060,568 B2 | 6/2006 | Metz et al. | |
| 7,064,066 B1 | 6/2006 | Metz et al. | |
| 7,074,680 B2 | 7/2006 | Doczy et al. | |
| 7,078,282 B2 | 7/2006 | Chau et al. | |
| 7,084,038 B2 | 8/2006 | Doczy et al. | |
| 7,087,476 B2 | 8/2006 | Metz et al. | |
| 7,122,870 B2 | 10/2006 | Barnak et al. | |
| 7,125,762 B2 | 10/2006 | Brask et al. | |
| 7,126,199 B2 | 10/2006 | Doczy et al. | |
| 7,129,182 B2 | 10/2006 | Brask et al. | |
| 7,138,323 B2 | 11/2006 | Kavalieros et al. | |
| 7,144,783 B2 | 12/2006 | Datta et al. | |
| 7,144,816 B2 | 12/2006 | Barns et al. | |
| 7,148,099 B2 | 12/2006 | Datta et al. | |
| 7,148,548 B2 | 12/2006 | Doczy et al. | |
| 7,153,734 B2 | 12/2006 | Brask et al. | |
| 7,153,784 B2 | 12/2006 | Brask et al. | |
| 7,157,378 B2 | 1/2007 | Brask et al. | |
| 7,160,767 B2 | 1/2007 | Brask et al. | |
| 7,160,779 B2 | 1/2007 | Doczy et al. | |
| 7,166,506 B2 | 1/2007 | Prince et al. | |
| 7,176,075 B2 | 2/2007 | Chau et al. | |
| 7,176,090 B2 | 2/2007 | Brask et al. | |
| 7,180,109 B2 | 2/2007 | Chau et al. | |
| 7,183,184 B2 | 2/2007 | Doczy et al. | |
| 7,187,044 B2 | 3/2007 | Liang et al. | |
| 7,192,856 B2 | 3/2007 | Doczy et al. | |
| 7,193,253 B2 | 3/2007 | Doczy et al. | |
| 7,208,361 B2 | 4/2007 | Shah et al. | |
| 7,220,635 B2 | 5/2007 | Brask et al. | |
| 7,271,045 B2 | 9/2007 | Prince et al. | |
| 7,285,829 B2 | 10/2007 | Doyle et al. | |
| 7,317,231 B2 | 1/2008 | Metz et al. | |
| 7,323,423 B2 | 1/2008 | Brask et al. | |
| 7,326,599 B2 | 2/2008 | Lochtefeld et al. | |
| 7,326,656 B2 | 2/2008 | Brask et al. | |
| 7,332,439 B2 | 2/2008 | Lindert et al. | |
| 7,338,847 B2 | 3/2008 | Shaheed et al. | |
| 7,354,832 B2 | 4/2008 | Rachmady et al. | |
| 7,355,281 B2 | 4/2008 | Brask et al. | |
| 7,361,958 B2 | 4/2008 | Brask et al. | |
| 7,381,608 B2 | 6/2008 | Brask et al. | |
| 7,384,880 B2 | 6/2008 | Brask et al. | |
| 7,387,927 B2 | 6/2008 | Turkot, Jr. et al. | |
| 7,390,709 B2 | 6/2008 | Doczy et al. | |
| 7,420,254 B2 | 9/2008 | Chau et al. | |
| 7,422,936 B2 | 9/2008 | Barns et al. | |
| 7,439,113 B2 | 10/2008 | Doczy et al. | |
| 7,439,571 B2 | 10/2008 | Doczy et al. | |
| 7,442,983 B2 | 10/2008 | Doczy et al. | |
| 7,449,756 B2 | 11/2008 | Metz et al. | |
| 7,871,915 B2 * | 1/2011 | Lim et al. | 438/592 |
| 8,039,381 B2 | 10/2011 | Yeh et al. | |
| 2002/0058374 A1 * | 5/2002 | Kim et al. | 438/228 |
| 2006/0008968 A1 * | 1/2006 | Brask et al. | 438/206 |
| 2006/0051957 A1 * | 3/2006 | Brask et al. | 438/637 |
| 2006/0278934 A1 | 12/2006 | Nagahama | |

* cited by examiner

METHODS OF FORMING CMOS TRANSISTORS WITH HIGH CONDUCTIVITY GATE ELECTRODES

REFERENCE TO PRIORITY APPLICATION

This application claims priority to Korean Patent Application No. 10-2009-0121108, filed Dec. 8, 2009, the contents of which are hereby incorporated herein by reference.

FIELD OF THE INVENTION

This invention relates to methods for manufacturing MOS transistors and, more particularly, to methods for manufacturing MOS transistors having gate electrodes formed of different metals.

BACKGROUND OF THE INVENTION

A MOS transistor is widely used as switching devices. In contrast to conventional MOS transistors containing a gate electrode which is formed of poly silicon, a metal material with superior electric conductivity better than the poly silicon have been used as the gate electrode of MOS transistors. MOS transistors are classified as n-MOS transistors or p-MOS transistors in accordance with the channel type which is induced beneath the gate electrode. The gate electrodes of the n-MOS transistor and the p-MOS transistor may be formed of different metals so that the n-MOS transistor and the p-MOS transistor have different threshold voltages.

SUMMARY

Methods of forming insulated-gate field effect transistors according to embodiments of the invention includes forming a gate insulating layer on a substrate and forming a dummy gate electrode on the gate insulating layer. Electrically insulating spacers are formed on sidewalls of the dummy gate electrode. These spacers and the dummy gate electrode are covered with an electrically insulating mold layer. An upper portion of the mold layer is then removed to expose an upper surface of the dummy gate electrode. The dummy gate electrode is then removed from between the spacers by selectively etching back the dummy gate electrode using the mold layer and the spacers as an etching mask. A first metal layer is deposited onto an upper surface of the mold layer and onto inner sidewalls of the spacers. A space between the inner sidewalls of the spacers is filled with a dummy filler layer (e.g., polysilicon) that contacts the first metal layer. An upper portion of the first metal layer is removed from between the inner sidewalls of the spacers and the dummy filler layer. The dummy filler layer is then removed from between the inner sidewalls of the spacers to expose the first metal layer. A second metal layer is then deposited onto a portion of the first metal layer extending between the inner sidewalls of the spacers, to thereby define a metal gate electrode containing a composite of the first and second metal layers.

According to some of these embodiments of the invention, the step of filling a space between the inner sidewalls of the spacers is followed by a step of planarizing the dummy filler layer to expose a portion of the first metal layer on the upper surface of the mold layer. In addition, the step of forming a dummy gate electrode on the gate insulating layer may be preceded by forming a buffer gate electrode containing titanium nitride or tantalum nitride on the gate insulating layer. In addition, the step of removing an upper portion of the first metal layer may include selectively etching the first metal layer using the dummy filler layer and the mold layer as an etching mask. This first metal layer may include titanium nitride.

Still further embodiments of the invention include methods of forming CMOS transistors by forming first and second gate insulating layers on a substrate and forming first and second dummy gate electrodes on the first and second gate insulating layers, respectively. First and second electrically insulating spacers are formed on sidewalls of the first and second dummy gate electrodes, respectively. These first and second spacers and the first and second dummy gate electrodes are covered with an electrically insulating mold layer. An upper portion of the mold layer is removed to expose an upper surface of the first dummy gate electrode and an upper surface of the second dummy gate electrode. The first dummy gate electrode is selectively removed from between the first spacers using a mask to prevent removal of the second dummy gate electrode. A first metal layer is deposited onto an upper surface of the mold layer and onto inner sidewalls of the first spacers. A space between the inner sidewalls of the first spacers is filled with a dummy filler layer that contacts the first metal layer. An upper portion of the first metal layer is removed from between the inner sidewalls of the first spacers and the dummy filler layer. The dummy filler layer is removed from between the inner sidewalls of the first spacers to expose the first metal layer. This step is performed concurrently with removing the second dummy gate electrode from between inner sidewalls of the second spacers. A second metal layer is then deposited onto a portion of the first metal layer extending between the inner sidewalls of the first spacers to thereby define a first metal gate electrode including a composite of the first and second metal layers. This step is performed concurrently with depositing the second metal layer into a space between the inner sidewalls of the second spacers to thereby define a second metal gate electrode.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures.

DETAILED DESCRIPTION OF THE EMBODIMENTS

Exemplary embodiments of the inventive concept will be described below in more detail with reference to the accompanying drawings. The embodiments of the inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, exemplary embodiments of the inventive concept will be described in detail with reference to the accompanying drawings.

FIGS. 1 through 17 are cross-sectional views illustrating a method for manufacturing a MOS transistor according to a first embodiment of the inventive concept.

Figure 1:
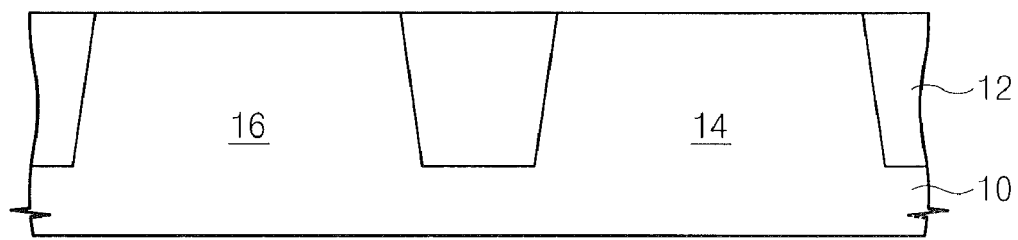
FIGS. 1 through 17 are cross-sectional views illustrating a method for manufacturing a MOS transistor according to a first embodiment of the inventive concept.

Referring to FIG. 1, a first well and a second well may be respectively formed in a first active region 14 and a second active region 16 which are defined by a device isolation layer 12 on a substrate 10. The first well may be formed in an ion implantation process in which impurities of a first conductivity type are injected in the substrate 10. The impurity of the first conductivity type may comprise a donor ion such as phosphorus or arsenic. For example, the impurities of the first conductivity type may be injected at an energy of about 100 KeV~300 KeV and a concentration of about $1 \times 10^{13}$ ea/cm$^3$~$1 \times 10^{16}$ ea/cm$^3$. The second well may be formed by an ion implantation process in which impurities of a second conductivity type opposite to the first conductivity type are injected in the substrate 10. The impurity of the second conductivity type may comprise an acceptor ion such as boron. For example, the impurities of the second conductivity type may be injected at an energy of about 70 KeV~200 KeV and a concentration of about $1 \times 10^{13}$ ea/cm$^3$~$1 \times 10^{16}$ ea/cm$^3$. The device isolation layer 12 may be formed after forming the first well and the second well. The device isolation layer 12 may comprise silicon oxide that is formed by a plasma enhanced chemical vapor deposition (PECVD). The silicon oxide is formed in a trench where a predetermined depth of the substrate 10 is removed.

Figure 2:
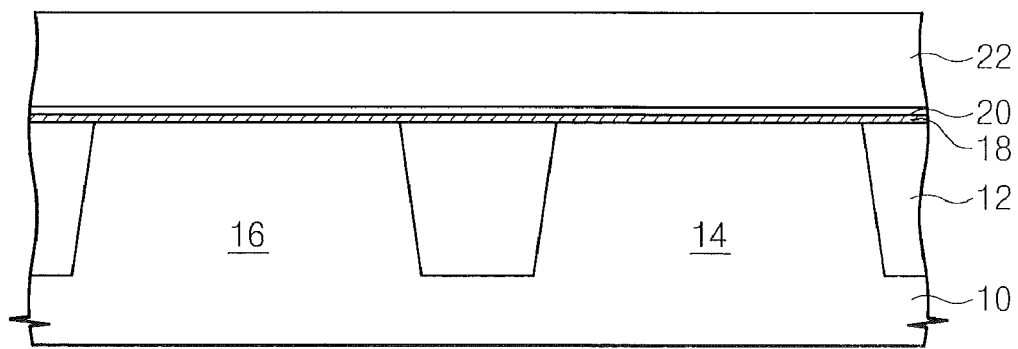

Referring to FIG. 2, a gate insulating layer 18, a buffer gate electrode 20 and a dummy gate electrode 22 may be stacked on the substrate 10. The gate insulating layer 18 may be formed of a high-k dielectric layer such as a hafnium oxide layer, a tantalum oxide layer and a silicon oxide layer. The gate insulating layer 18 may be formed to have thickness of about 30 Å~200 Å by a method such as chemical vapor deposition (CVD), atomic layer deposition (ALD) or rapid thermal process (RTP). The buffer gate electrode 20 may comprise a titanium nitride layer or a tantalum nitride layer. The buffer gate electrode 20 may be formed to have thickness of about 20 Å~50 Å by a method such as CVD or ALD. The dummy gate electrode 22 may comprise poly silicon that is formed by a chemical vapor deposition.

Figure 3:
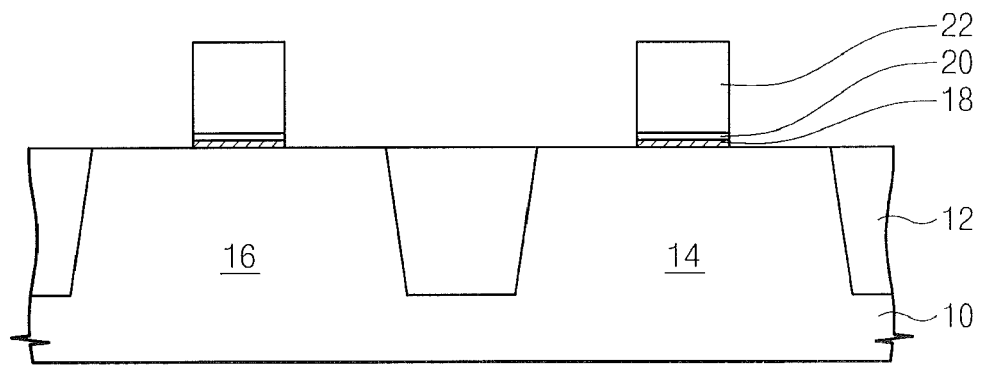

Referring to FIG. 3, a dummy gate stack 24 comprising the gate insulating layer 18, the buffer gate electrode 20 and the dummy gate electrode 22 may be formed on the first active region 14 and the second active region 16. The dummy gate stack 24 may be patterned using a photo lithography process and an etching process. The photo lithography and the etching process may be performed as follows. Initially, a first photo resist pattern (not shown) may be formed on the dummy gate electrode 22. The dummy gate electrode 22, the buffer gate electrode 20 and the gate insulating layer 18 may be successively etched using the first photo resist pattern as an etch mask.

Figure 4:
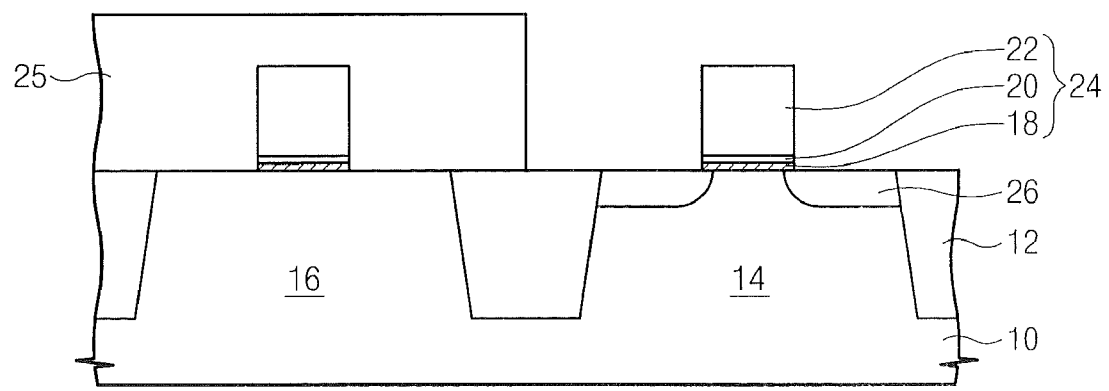

Referring to FIG. 4, a second photo resist pattern 25 may be formed to cover the second active region 16. A lightly doped drain (LDD) 26 is formed using the second photo resist pattern 25 and the dummy gate electrode 22 as an ion implantation mask. The impurities of the second conductivity type may be injected into the first active region 14. The impurities of the second conductivity type may be injected at an energy of about 1 KeV~20 KeV and a concentration of about $1 \times 10^{13}$ ea/cm$^3$~$1 \times 10^{16}$ ea/cm$^3$. The second photo resist pattern 25 is removed.

Figure 5:
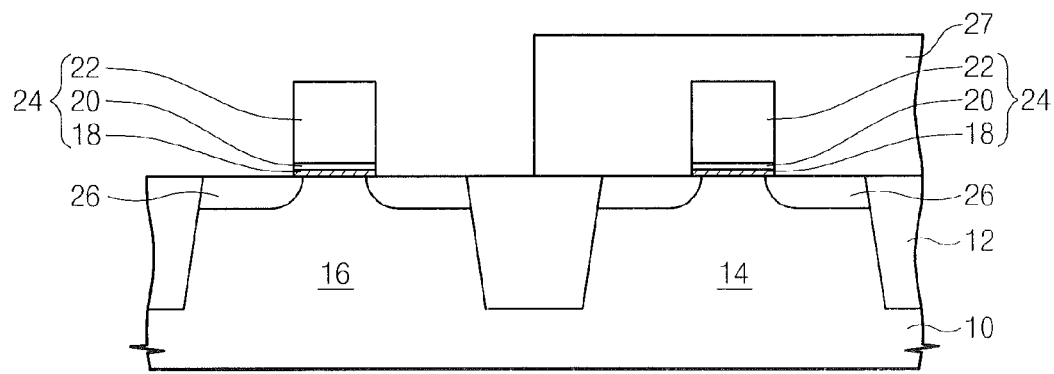

Referring to FIG. 5, a third photo resist pattern 27 may be formed to cover the first active region 14. A LDD 26 may be formed in the second active region using the third photo resist pattern 27 and the dummy gate electrode 22 as an ion implantation mask. Impurities of the first conductivity type may be injected into the second active region 16. The impurities of the first conductivity type may be injected at an energy of about 5 KeV~30 KeV and a concentration of about $1 \times 10^{13}$ ea/cm$^3$~$1 \times 10^{16}$ ea/cm$^3$. The LDDs 26 may be formed of the same depth in the first active region 14 and the second active region 16, and diffused to the same distant below the dummy gate stack 24. The photo resist pattern 27 is removed.

Figure 6:
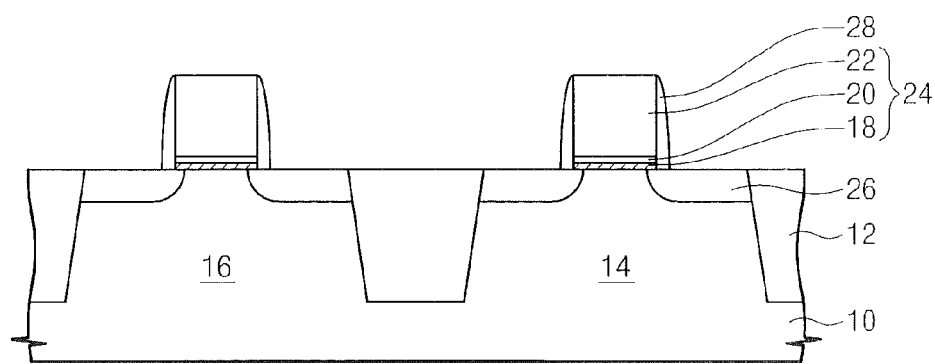

Referring to FIG. 6, a spacer 28 may be formed on a sidewall of the dummy gate stack 24. The spacer 28 may comprise a silicon nitride layer which is formed by a chemical vapor deposition process. The spacer 28 may be formed by a self alignment method. For example, a silicon nitride layer is formed to cover the dummy gate stack 24, and the silicon nitride layer is then anisotropically etched to remain on the sidewall of the dummy gate stack 24.

Figure 7:
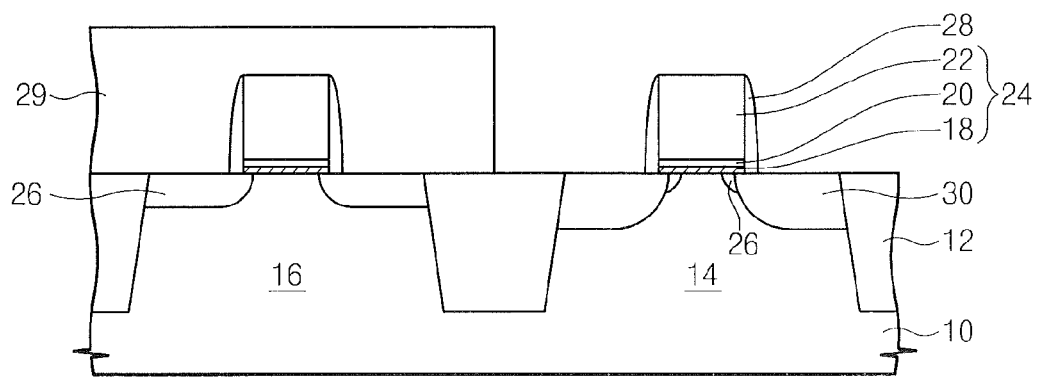

Referring to FIG. 7, a fourth photo resist pattern 29 may be formed to cover the second active region 16. A source/drain region 30 may be formed in the first active region using the fourth photo resist pattern 29, the dummy gate electrode 22 and the spacer 28 as an ion implantation mask. The source/drain region 30 may comprise impurities of the second conductivity type. The impurities of the second conductivity type may be injected at an energy of about 10 KeV~40 KeV and a concentration of about $1 \times 10^{16}$ ea/cm$^3$~$1 \times 10^{17}$ ea/cm$^3$. The fourth photo resist pattern 29 on the second active region 16 is removed.

Figure 8:
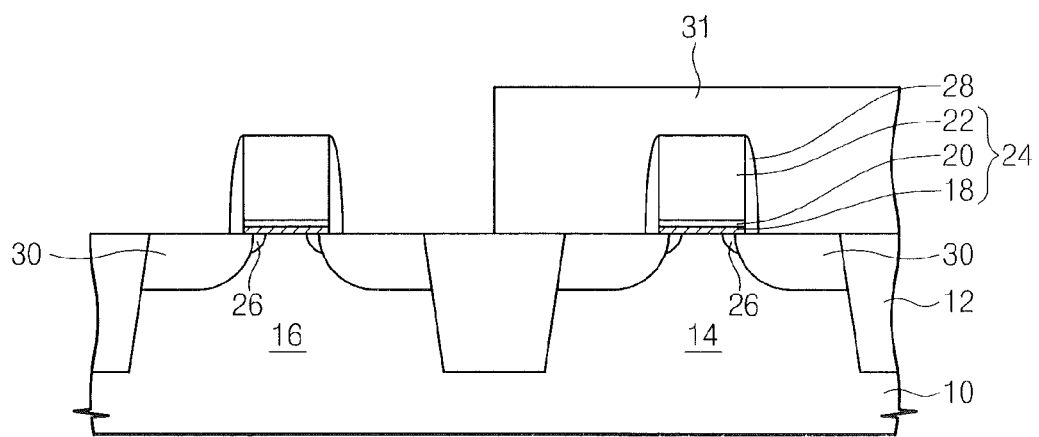

Referring to FIG. 8, a fifth photo resist pattern 31 is formed to cover the first active region 14. A source/drain region 30 may be formed in the second active region 16 using the fifth photo resist pattern 31, the dummy gate electrode 22 and the spacer 28 as an ion implantation mask. The source/drain region 30 in the second active region 16 may comprise impurities of the first conductive type. For example, The impurities of the first conductivity type may be injected in the second active region 16 at an energy of about 10 KeV~50 KeV and a concentration of about $1 \times 10^{16}$ ea/cm$^3$~$1 \times 10^{17}$ ea/cm$^3$. The source/drain regions 30 in the first active region 14 and the second active region may be the same depth. The photo resist pattern 31 may be then removed.

Although not shown in drawings, the source/drain region 30 may be formed by removing portions of the first active region 14 and the second active region 16 and filling an epitaxial silicon germanium with impurities of respective conductivity type in the removed portions of the first active region 14 and the second active region 16.

Figure 9:
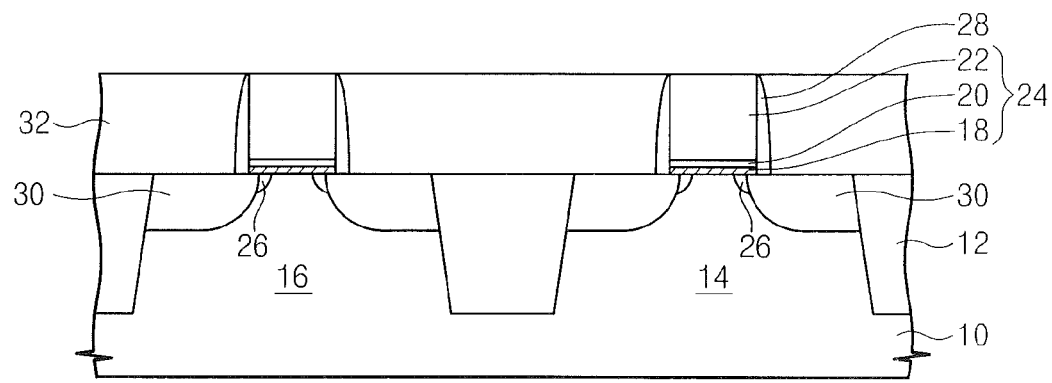

Referring to FIG. 9, a mold insulating layer 32 is formed to cover the source/drain region 30 and the dummy gate stack 24. The mold insulating layer 32 may comprise a silicon oxide layer. The mold insulating layer 32 may be formed in a low pressure chemical vapor deposition (LPCVD) process or plasma enhanced chemical vapor deposition (PECVD) process. The mold insulating layer 32 may be planarized such that the dummy gate electrode 22 may be formed. The planarization of the mold insulating layer 32 may be performed by a method such as chemical mechanical polishing (CMP) or etch-back.

Figure 10:
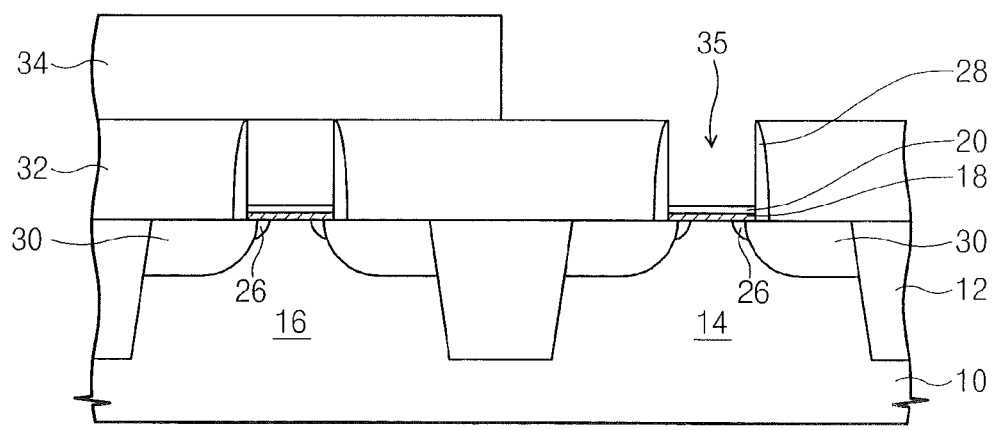

Referring to FIG. 10, the dummy gate electrode 22 on the first active region 14 may be selectively removed to form a first trench 35. The removing of the dummy gate electrode 22 may comprise forming a sixth photo resist pattern 34 to cover the second active region 16 while exposing the dummy gate electrode 22 on the first active region 14, and etching the dummy gate electrode 22 in a dry or wet etching process. The sixth photo resist pattern 34, the mold insulating layer 32 and the spacer 28 on the substrate 10 may be used as an etch mask while the dummy gate electrode 22 is removed. The buffer gate electrode 20 may be used as an etch stop layer during the dummy gate electrode 22 etching. The sixth photo resist pattern 34 formed on the second active region 16 is removed.

Figure 11:
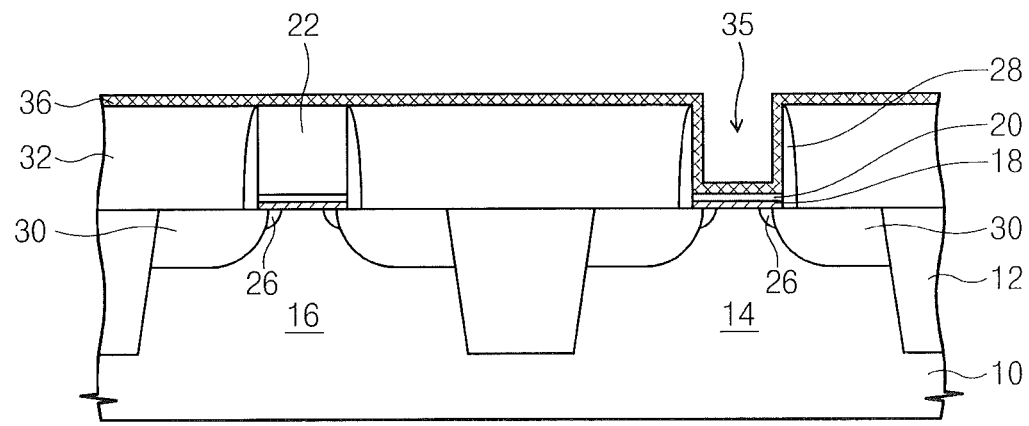

Referring to FIG. 11, a first metal layer 36 may be formed on the entire surface of the substrate 10. The first metal layer 36 may comprise a titanium nitride layer that is formed by a chemical vapor deposition (CVD) or an atomic layer deposition (ALD). The first metal layer 36 may be formed of the same thickness on the bottom surface and the sidewall of the mold insulating layer 32 as well as a top surface of the mold insulating layer 32. If the first metal layer 36 is buried in the first trench 35, the first metal layer 36 in the first trench 35 may comprise a void formed by overhang of the first metal layer 36. The void may be caused by losing conductive reliability of the first metal layer 36. Therefore, the first metal layer 36 may be formed of uniform thickness on the bottom and the sidewall of the first trench 35.

Figure 12:
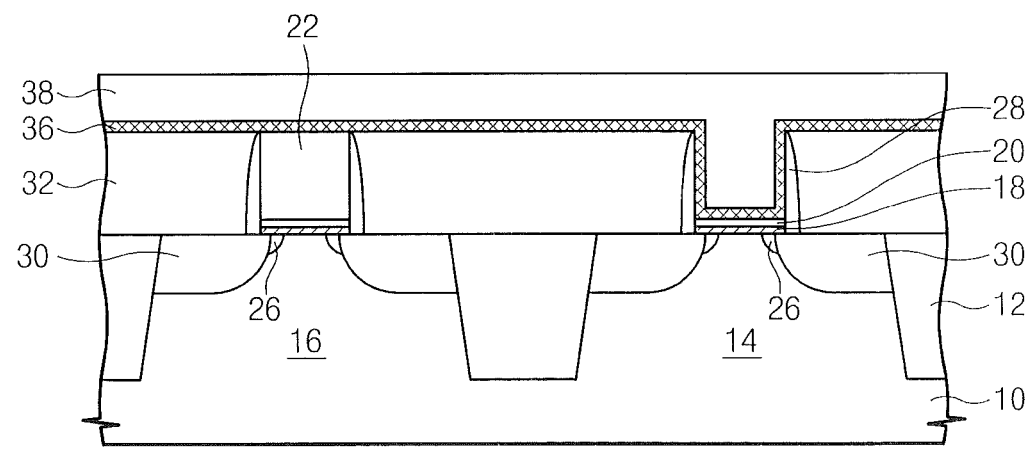

Referring to FIG. 12, a dummy filler layer 38 may be stacked on the first metal layer 36. The dummy filler layer 38 may be formed of the same material as the dummy gate electrode 22. The dummy filler layer 38 may comprise poly silicon. The dummy filler 38 may be completely fill the first trench 35 on the first active region 14. The poly silicon may be formed by a chemical vapor deposition method. The dummy filler layer 38 may comprise a void in the first trench 35.

Figure 13:
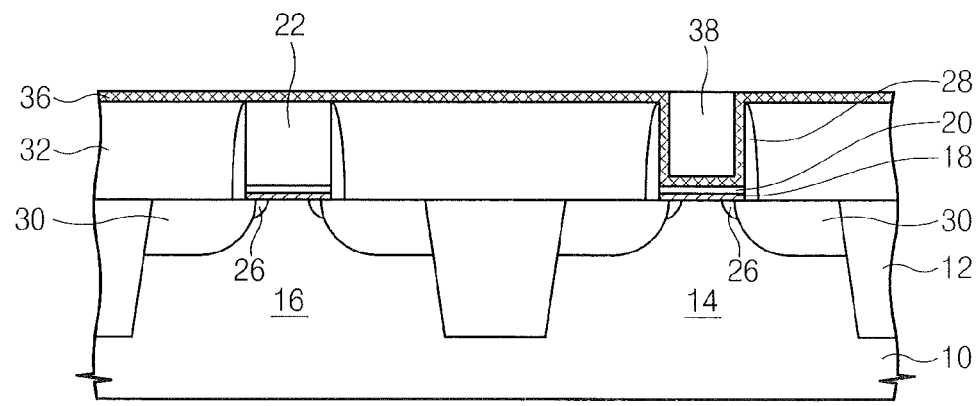

Referring to FIG. 13, the dummy filler layer 38 may be planarized to expose the first metal layer 36. The planarization of the dummy filler layer 38 may be performed by a chemical mechanical polishing (CMP) or an etch-back. The dummy filler layer 38 may remain in the first trench 35.

Figure 14:
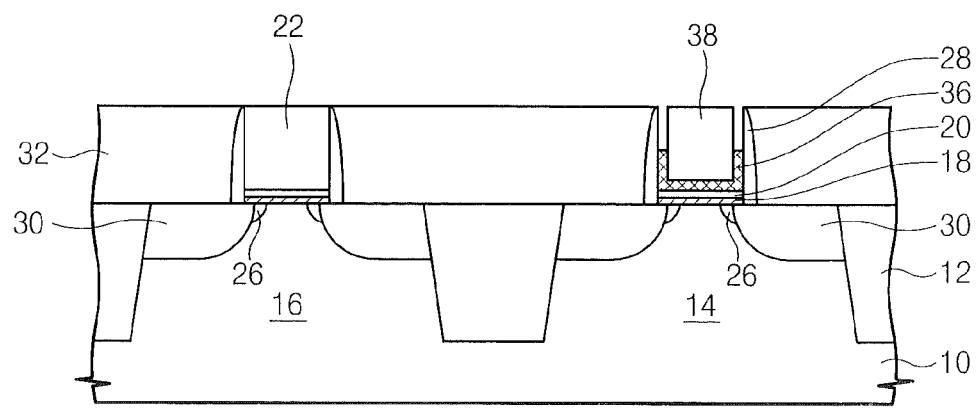

Referring to FIG. 14, the first metal layer 36 on the mold insulating layer 32 is removed. And, an upper portion of the first metal layer 36 disposed between the mold insulating layer 32 and the dummy filler layer 38 becomes recessed. The removing process of the first metal layer 36 may be performed in a dry or wet etching method in which etching selectivity to the first metal layer 36 is two or more times greater than to the dummy filler layer 38 and the mold insulating layer 32. The first metal layer 36 may remain on the bottom surface and a lower sidewall of the first trench 35. The first metal layer 36 may be formed symmetrically on both sidewall of the first trench 35. Therefore, the first metal layer 36 may be remained in the first trench 35 to form a first metal pattern with a 'U' shaped section.

Figure 15:
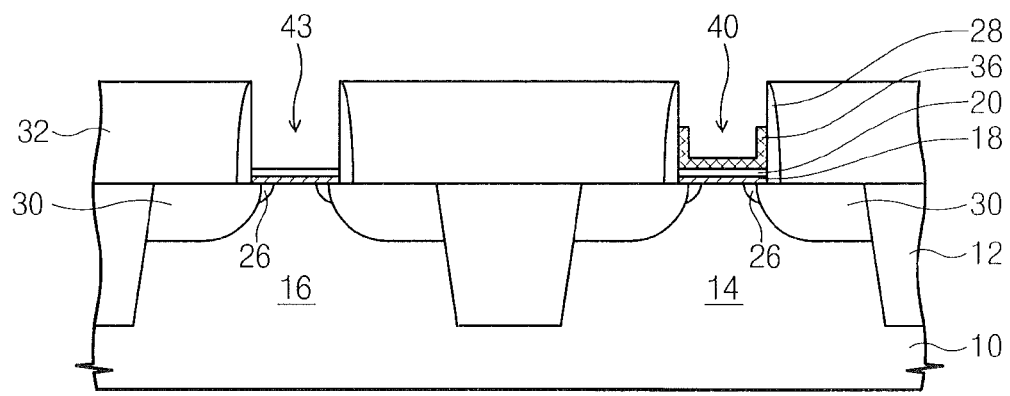

Referring to FIG. 15, the dummy filler layer 38 on the first active region 14 and the dummy gate electrode 22 on the second active region 15 may be removed to form a second trench 40 on the first active region 14 and a third trench 43 on the second active region. The dummy gate electrode 22 and the dummy filler layer 38 may be removed simultaneously in an etching process because the dummy gate electrode 22 and the dummy filler layer 38 are formed of poly silicon. Thus, the method for manufacturing a MOS transistor according to first embodiment can improve or maximize the productivity.

The first metal layer 36 may be exposed in the second trench 40 on the first active region 14, and the buffer gate electrode 20 may be exposed in the third trench 43 on the second active region 16. The second trench 40 may be shallower than the third trench 43. The first metal layer 36 may be disposed on the bottom surface and the lower sidewall of the second trench 40. The second trench 40 and the third trench 43 may be different from each other in thickness.

Figure 16:
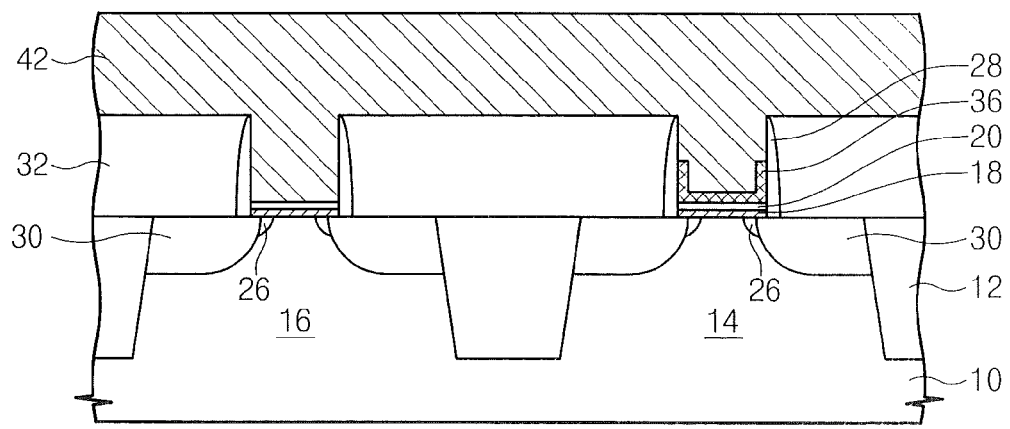

Referring to FIG. 16, a second metal layer 42 may be formed on the entire surface of the substrate 10. The second metal layer 42 may fill the second trench 40 and the third trench 43. The second metal layer 42 may comprise at least one of aluminum, tungsten, titanium and tantalum that is formed by a method such as PVD or CVD. The second metal layer 42 may be formed without a void in the second trench 40 on the first active region 14.

Figure 17:
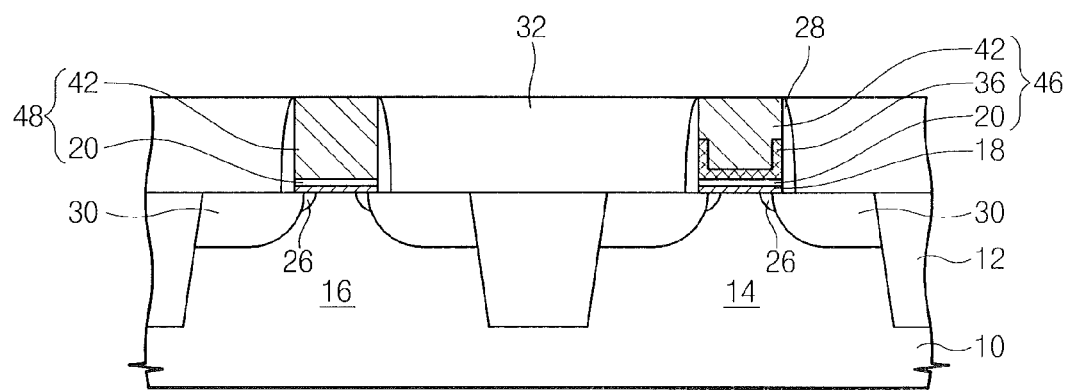

Referring to FIG. 17, the second metal layer 42 is planarized to expose the mold insulating layer 32. A first gate electrode 46 and a second gate electrode 48 may be formed on the first active region 14 and the second active region, respectively. The first gate electrode 46 and the second gate electrode 48 may be extended in a vertical direction to the direction of the source/drain regions 30 arrangement. The second metal layer 42 may be planarized by a method such as CMP or etch-back. The second metal layer 42 may be planarized to separate the first gate electrode 46 and the second gate electrode 48. The first gate electrode 46 and the second gate electrode 48 may be formed to have top surfaces of substantially equal level. The first gate electrode 46 may comprise the buffer gate electrode 20, the first metal layer 36 and the second metal layer 42. The first gate electrode 46 may compose a p-MOS transistor on the first active region 14. The second gate electrode 48 may comprise the buffer gate electrode 20 and the second metal layer 42. The second gate electrode 48 may compose an n-MOS transistor on the second active region 16.

In general, the operating voltage of the n-MOS transistor and the p-MOS transistor may be different from each other. Current of the n-MOS transistor may be adjusted in accordance with a switching voltage. Thus, the second gate electrode 48 may comprise less than two metal layers in order to simplify the estimation of an electric resistance or a work function according to combination of the metal layers. The p-MOS transistor may be different from the n-MOS transistor in operating voltage. The first gate electrode 46 may comprise at least two metal layers because the p-MOS transistor performs a simple switching operation. For example, the operating voltage may be lower to the p-MOS transistor than to the n-MOS transistor. If a void is formed in the first gate electrode 46, operation characteristic of the p-MOS transistor may be deteriorated. According to the first embodiment, the first gate electrode 46 does not have a void to thereby prevent the operation characteristic of the p-MOS transistor from deterioration.

Not shown in drawings, the mold insulating layer 32 on the source/drain region 30 may be removed to form a contact hole, and a source/drain electrode may be formed in the contact hole.

Figure 18:
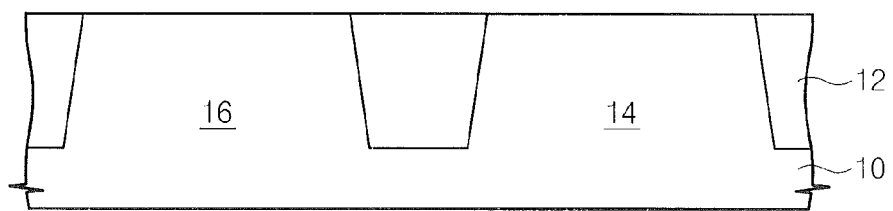
FIGS. 18 through 37 are cross-sectional views illustrating a method for manufacturing a MOS transistor according to a second embodiment of the inventive concept.

FIGS. 18 through 37 are cross-sectional views illustrating a method for manufacturing a MOS transistor according to a second embodiment of the inventive concept. Referring to FIG. 18, a first well and a second well may be formed in a first active region 14 and a second active region 16 that are defined by a device isolation layer 12 on a substrate 10. The first well may be formed by injecting impurities of a first conductivity type. The impurities of the first conductivity type may comprise donor ions such as phosphorus or arsenic ions. The impurities of the first conductivity type may be injected in the first well at an energy of about 100 KeV~300 KeV and a concentration of about $1\times10^{13}$ ea/cm$^3$~$1\times10^{16}$ ea/cm$^3$. The second well may be formed by injecting impurities of a second conductivity type opposite to the first conductivity type. The impurities of the second conductivity type may be injected in the second well at an energy of about 70 KeV~200 KeV and a concentration of about $1\times10^{13}$ ea/cm$^3$~$1\times10^{16}$ ea/cm$^3$. The device isolation layer 12 may be formed after forming the first and the second wells. The device isolation layer 12 may comprise a silicon oxide layer that is formed in a trench by a PECVD method. The substrate may be removed at a predetermined depth to form the trench.

Figure 19:
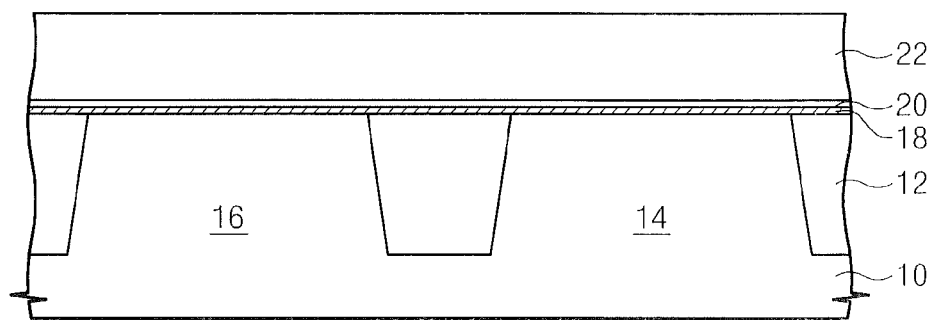

Referring to FIG. 19, a gate insulating layer 18, a buffer gate electrode 20 and a dummy gate electrode 22 may be stacked on the substrate 10. The gate insulating layer 18 may comprise at least one of hafnium oxide, tantalum oxide, silicon oxide and other high-k dielectric layer. The gate insulating layer 18 may be formed to have a depth of about 30 Å~200 Å by a method such as CVD, ALD or RTP. The buffer gate electrode 20 may comprise a titanium nitride layer or a tantalum nitride layer. The buffer gate electrode 20 may be formed to have a depth of about 20 Å~50 Å. The dummy gate electrode 22 may comprise poly silicon that is formed by CVD.

Figure 20:
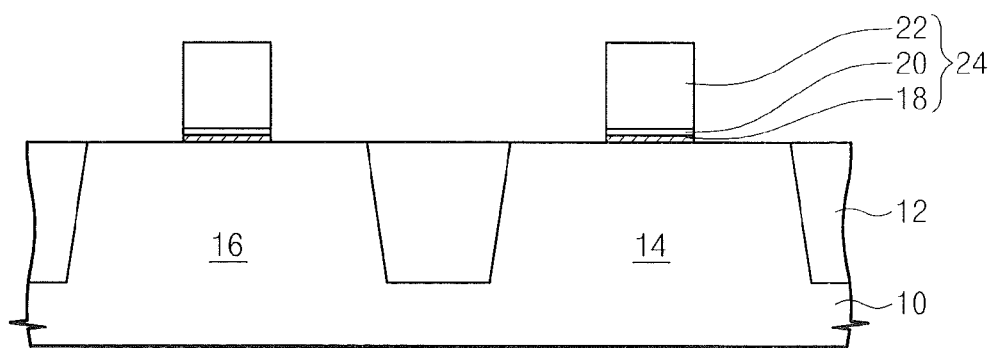

Referring to FIG. 20, a dummy gate stack 24 may be formed on the first active region 14 and the second active region 16. The dummy gate stack 24 may comprise the gate insulating layer 18, the buffer gate electrode 20 and the dummy gate electrode 22. The dummy gate stack 24 may be patterned in a photo lithography process and an etching process. For example, the photo lithography process and the etching process may comprise forming a first photo resist pattern on the dummy gate electrode 22, and successively etching the dummy gate electrode 22, the buffer gate electrode 20 and the gate insulating layer using the first photo resist pattern as an etching mask.

Figure 21:
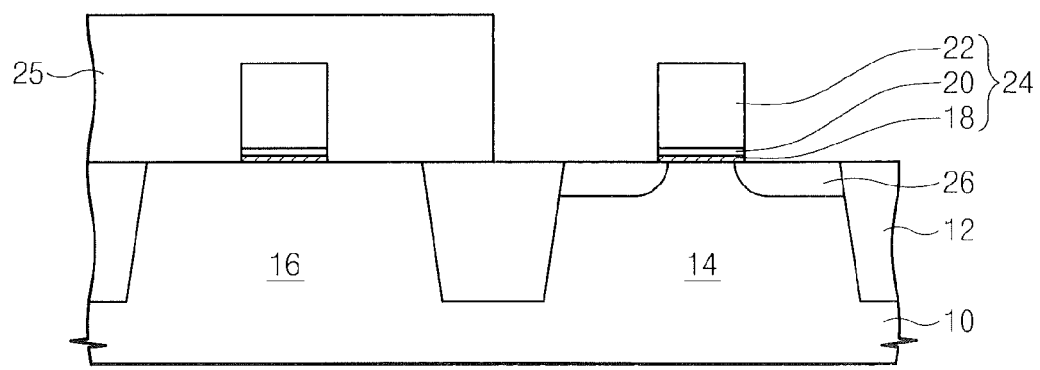

Referring to FIG. 21, a second photo resist pattern 25 may be formed to cover the second active region 16. An LDD (lightly doped drain) 26 is formed in the first active region 14 using the second photo resist pattern 25 and the dummy gate electrode 22 as an ion implantation mask. Impurities of the second conductivity type may be ion implanted in the first active region. The impurities of the second conductivity type may be implanted at an energy of about 1 KeV~20 KeV and a concentration of about $1 \times 10^{13}$ ea/cm$^3$~$1 \times 10^{16}$ ea/cm$^3$. The second photo resist pattern 25 is removed.

Figure 22:
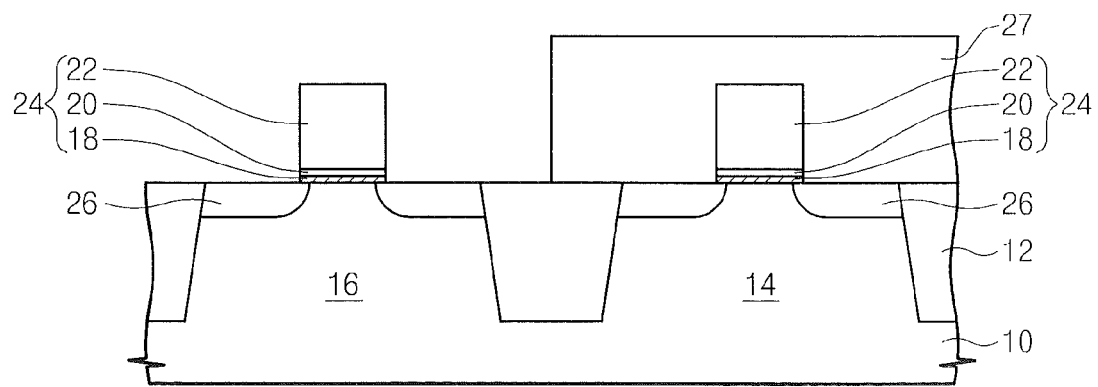

Referring to FIG. 22, a third photo resist pattern 27 may be formed to cover the first active region 14. An LDD 26 is formed in the second active region 16 using the third photo resist pattern 27 and the dummy gate electrode 22 as an ion implantation mask. Impurities of the first conductivity type may be ion implanted in the second active region. The impurities of the first conductivity type may be implanted at an energy of about 5 KeV~30 KeV and a concentration of about $1 \times 10^{13}$ ea/cm$^3$~$1 \times 10^{16}$ ea/cm$^3$. The LDDs 26 of the same depth may be formed in the first active region 14 and the second active region 16. The LDDs 26 may be diffused to the same distance. The third photo resist pattern 27 is removed.

Figure 23:
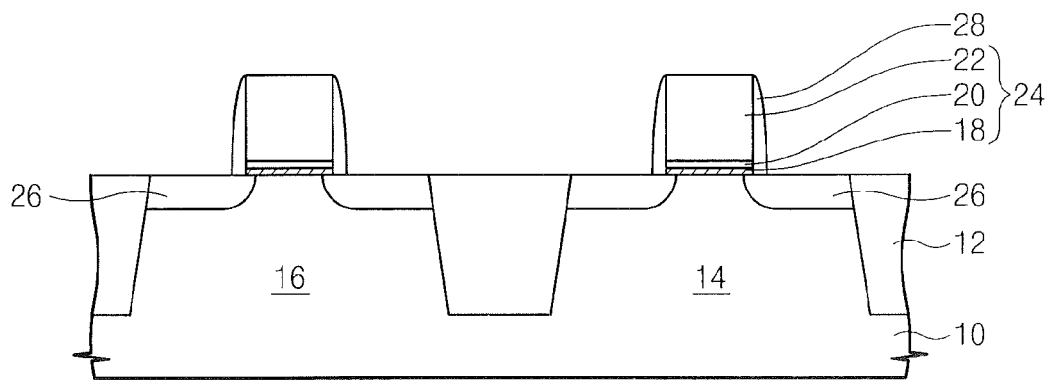

Referring to FIG. 23, a spacer 28 is formed on a sidewall of the dummy gate stack 24. The spacer 28 may comprise a silicon nitride layer that is formed by CVD. The spacer 28 may be formed by a self-alignment method. The self-alignment method may comprise forming a silicon nitride to cover the dummy gate stack 24 and etching anisotropically the silicon nitride to remain the silicon nitride on the sidewall of the dummy gate stack.

Figure 24:
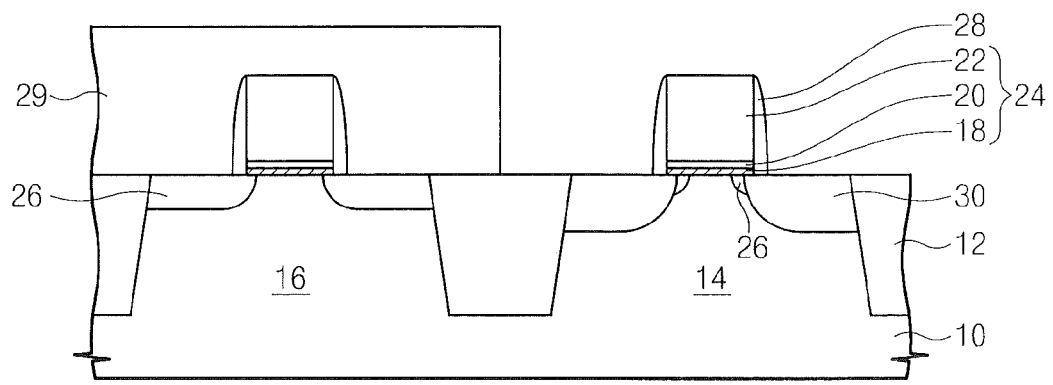

Referring to FIG. 24, a fourth photo resist pattern 29 is formed to cover the second active region 16. A source/drain region 30 may be formed in the first active region 14 using the fourth photo resist pattern 29 and the dummy gate electrode 22 and the spacer 28 as an ion implantation mask. The source/drain region 30 in the first active region 14 may comprise impurities of the second conductivity type. For example, the impurities of the second conductivity type may be injected at an energy of about 10 KeV~40 KeV and a concentration of about $1 \times 10^{16}$ ea/cm$^3$~$1 \times 10^{17}$ ea/cm$^3$. The fourth photo resist pattern 29 is removed.

Figure 25:
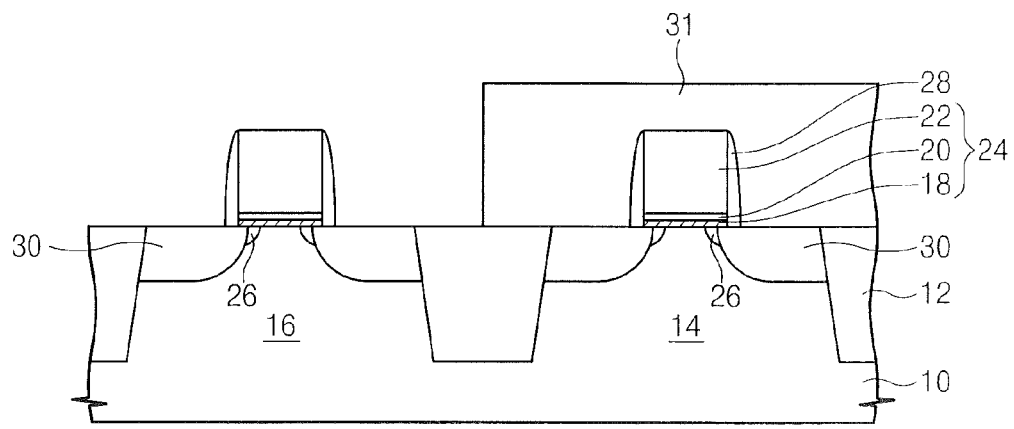

Referring to FIG. 25, a fifth photo resist pattern 31 is formed to cover the first active region 14. A source/drain region 30 may be formed in the second active region 16 using the fifth photo resist pattern 31, the dummy gate electrode 22 and the spacer 28 as an ion implantation mask. The source/drain region 30 may comprise impurities of the first conductivity type. For example, the impurities of the first conductivity type may be injected into the second active region 16 at an energy of about 10 KeV~50 KeV and a concentration of about $1 \times 10^{16}$ ea/cm$^3$~$1 \times 10^{17}$ ea/cm$^3$. The source/drain region 30 may be formed at the same depth in the first active region 14 and the second active region 16. The fifth photo resist pattern 31 may be removed from the substrate 10.

Although not shown in drawings, the source/drain region 30 may be formed by removing portions of the first active region 14 and the second active region 16 at both sides of the dummy gate stack 24 and filling epitaxial silicon germanium with respective impurities in the removed portions.

Figure 26:
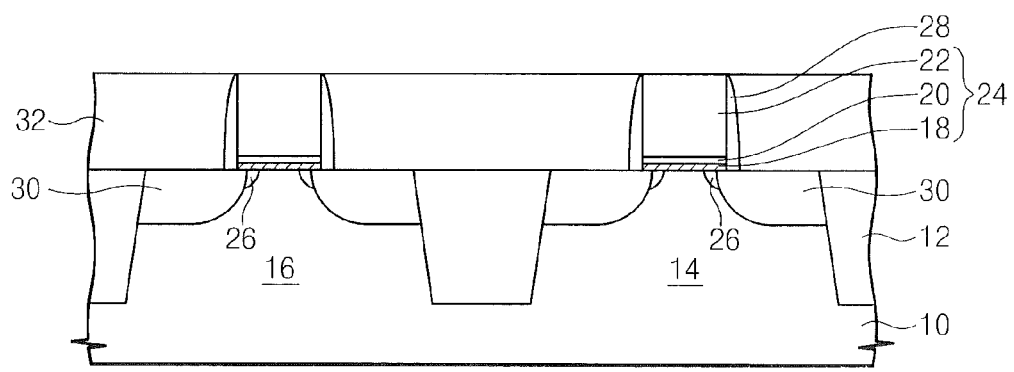

Referring to FIG. 26, a mold insulating layer 32 is formed to cover the device isolation layer 12, the source/drain region 30 and the dummy gate stack 24. The mold insulating layer 32 may be formed by a method such as LPCVD or PECVD. The mold insulating layer 32 may be planarized to expose the dummy gate electrode 22. The planarization of the mold insulating layer 32 may be performed by a method such as CMP or etch-back process.

Figure 27:
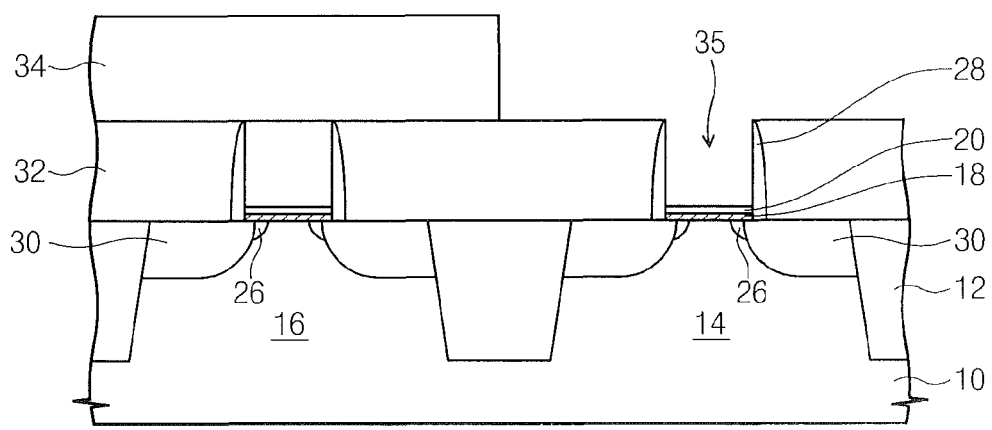

Referring to FIG. 27, the dummy gate electrode 22 on the first active region 14 may be selectively removed to form a first trench 35. The removing of the dummy gate electrode 22 may comprise forming a sixth photo resist pattern 34 to cover the second active region 16 while exposing the first active region 14, and etching the dummy gate electrode 22 in a dry or wet etching process. The dummy gate electrode 22 may be removed using the sixth photo resist pattern 34, the mold insulating layer 32 and the spacer 28 disposed on the substrate 10 as an etching mask. The buffer gate electrode 20 may be used as an etch stop layer during the dummy gate electrode 22 etching. The sixth photo resist pattern 34 is removed from the second active region.

Figure 28:
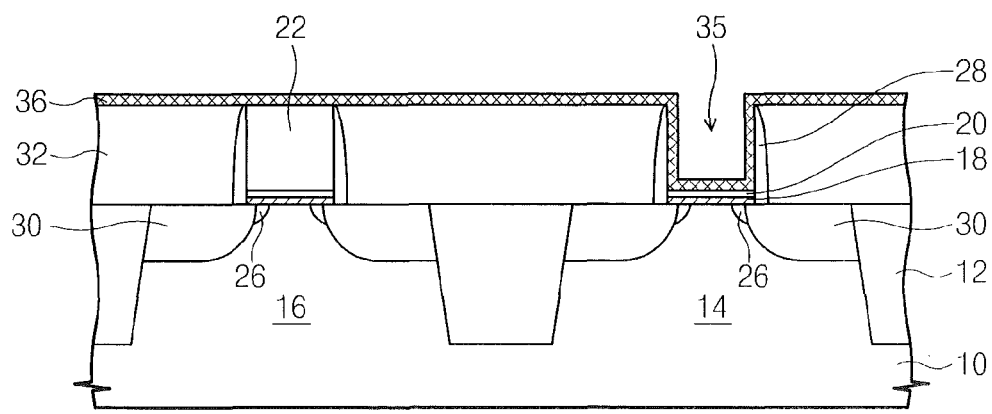

Referring to FIG. 28, a first metal layer 36 is formed on the entire surface of the substrate 10. The first metal layer 36 may comprise a titanium nitride layer (TiN) that is formed by a method such as CVD or ALD. The first metal layer 36 may be formed of the same thickness on a bottom and a sidewall of the first trench 35 as well as a top surface of the first trench 35. If the first metal layer 36 is buried in the first trench 35, the first metal layer 36 in the first trench 35 may comprise a void formed by overhang of the first metal layer 36. Thus, in the embodiment of the inventive concept, the first metal layer 36 may be formed to have uniform thickness on the bottom and the sidewall of the first trench 35. For example, the first metal layer 36 may be formed to have thickness of about 20 Å~200 Å.

Figure 29:
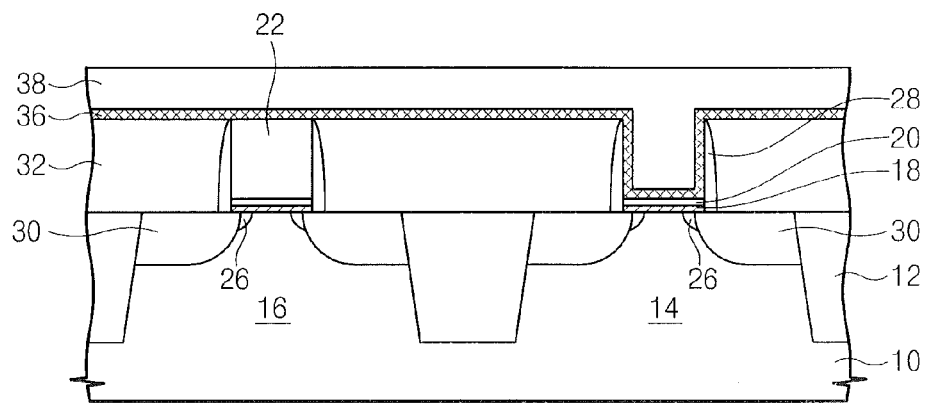

Referring to FIG. 29, a dummy filler layer 38 may be formed on the first metal layer 36. The dummy filler layer 38 may comprise a silicon oxide layer that is formed by a spin on glass (SOG) method. The dummy filler layer 38 may completely fill the first trench 35. The dummy filler layer 38 may comprise a void in the first trench.

Figure 30:
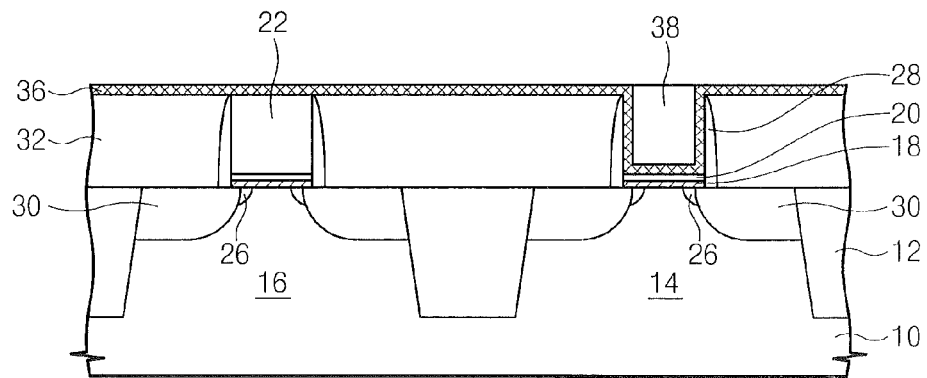

Referring to FIG. 30, the dummy filler layer 38 may be planarized to expose the first metal layer 36. The dummy filler layer 38 may be planarized in a CMP process or an etch-back process. The dummy filler layer 38 may be remained just in the first trench 35.

Figure 31:
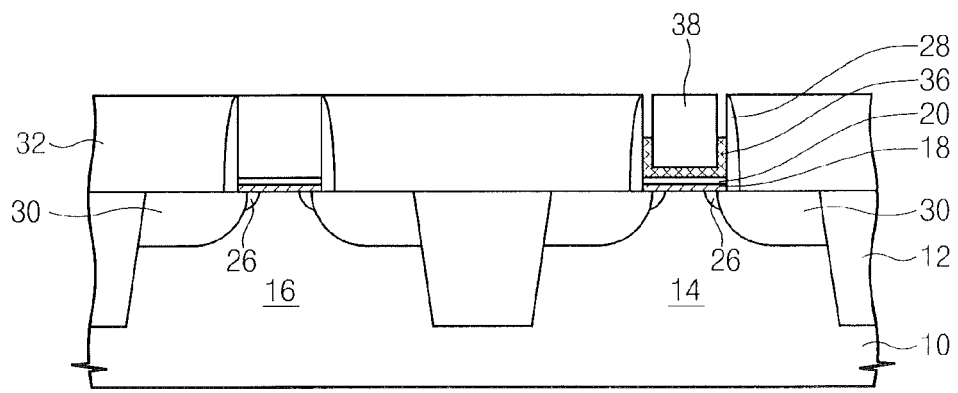

Referring to FIG. 31, the first metal layer 36 on the mold insulating layer 32 is removed. An upper portion of the first metal layer 36 disposed between the mold insulating layer 32 and the dummy filler layer 38 may be removed to form a recess. The removing of the first metal layer 36 may be performed in a dry or wet etching process in which etching selectivity is over twice to the first metal layer 36 than to the dummy filler layer 38 and the mold insulating layer 32. The first metal layer 36 may be remained on the bottom surface of the first trench 35 and a lower sidewall of the first trench 35. The first metal layer 36 may be formed symmetrically on both sidewalls of the first trench 35. The first metal layer 36 may have U-shaped section as a first metal pattern.

Figure 32:
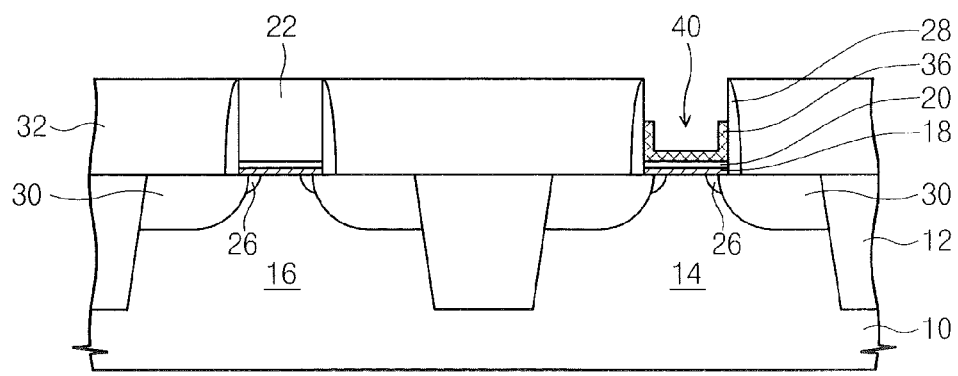

Referring to FIG. 32, the dummy filler layer 38 is removed to form a second trench 40 on the first active region 14. The dummy filler layer 38 may be etched in an etching process in which etching selectivity is over twice to the dummy filler layer 38 than to the dummy gate electrode 22, the mold insulating layer 32 and the first metal layer 36. The second trench 40 may be shallower than the first trench 36 because of the first metal layer 38. The first metal layer 36 is form on a lower sidewall of the second trench 40. The second trench 40 may have a beginning of the same size as the first trench 35.

Figure 33:
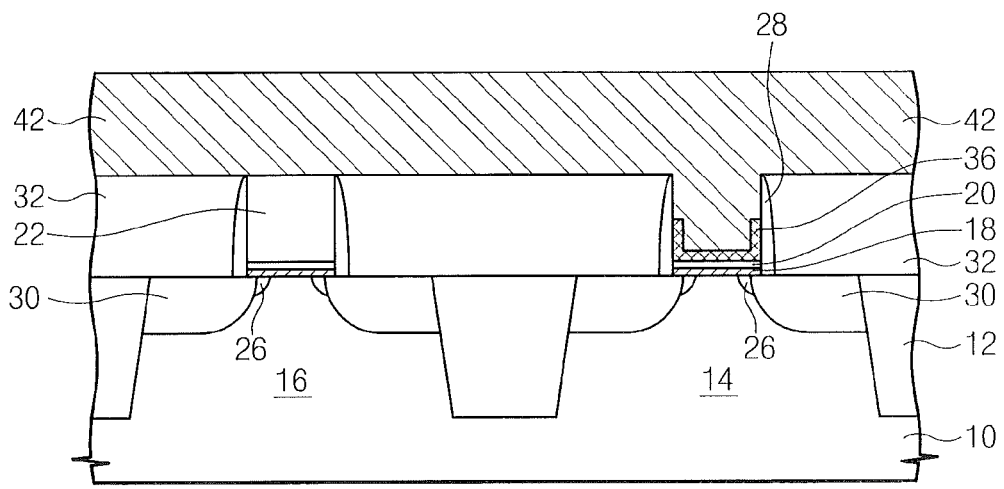

Referring to FIG. 33, a second metal layer 42 is formed on the first metal layer 36. The second metal layer 42 may be formed on the entire surface of the substrate 10 while filling the second trench 40. The second metal layer 42 may comprise at least one of aluminum, tungsten and titanium that are formed by PVD or CVD. The second metal layer 42 may be formed without a void in the second trench 40 on the first active region 14. Since the second trench 40 is shallower than the first trench 35 and has the beginning of the same size as the first trench has, the second metal layer 42 can be formed without forming an overhang at the beginning of the second trench 40.

Figure 34:
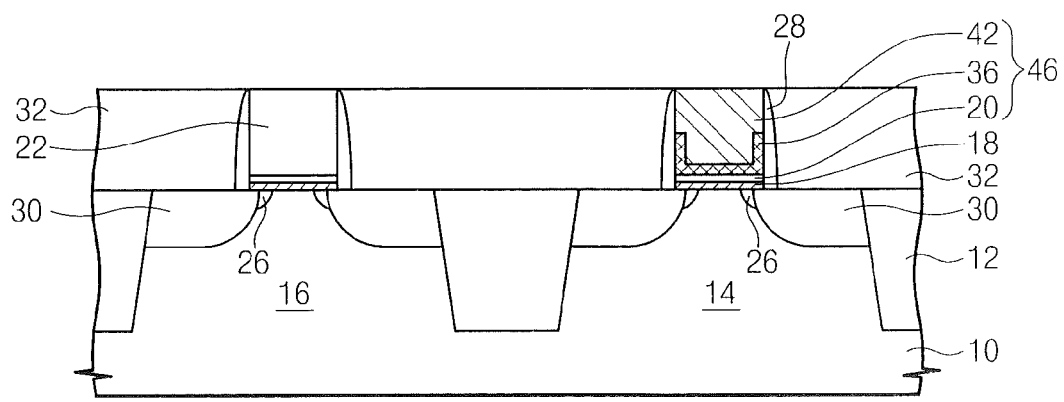

Referring to FIG. 34, the second metal layer 42 may be removed to be planarized. The planarization of the second metal layer 42 may be performed by CMP or etch-back. As a result, a first gate electrode 46 is formed on the first active region 14. The first gate electrode 46 may be extended in a vertical direction to the arrangement direction in which the source/drain regions 30 are arranged. The first gate electrode 46 may comprise the first metal layer 36 and the second metal layer 42. The first gate electrode 46 may compose a p-MOS transistor on the first active region 14. Material and thickness of the buffer gate electrode 20, the first metal layer 36 and the second metal layer 42 may be selected according to the desired electric resistance and work function of the p-MOS transistor. Since p-MOS transistors require a simple switching operation, the first gate electrode with more than 2 metal layers may be adapted.

Figure 35:
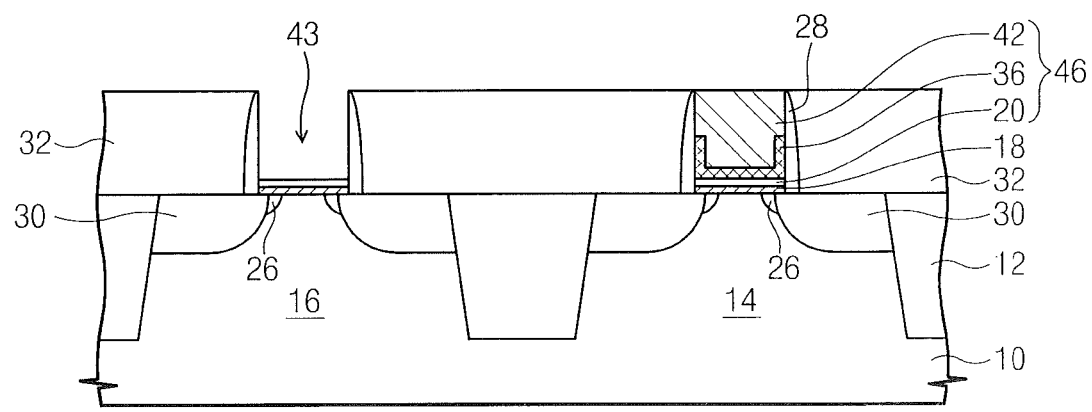

Referring to FIG. 35, the dummy gate electrode 22 on the second active region 16 may be removed to form a third trench 43 on the second active region 16. The dummy gate electrode 22 may be etched by a dry or wet etching process in which the dummy gate electrode 22 has etching selectivity to the second metal layer 42. When etching selectivity to the dummy gate electrode 22 and the second metal layer 42 is not sufficient, a seventh photo resist pattern may be formed on the first active region. The dummy gate electrode 22 may be removed then using the seventh photo resist pattern as an etch mask. The buffer gate electrode 20 on the second active region 16 may be exposed in the third trench 43.

Figure 36:
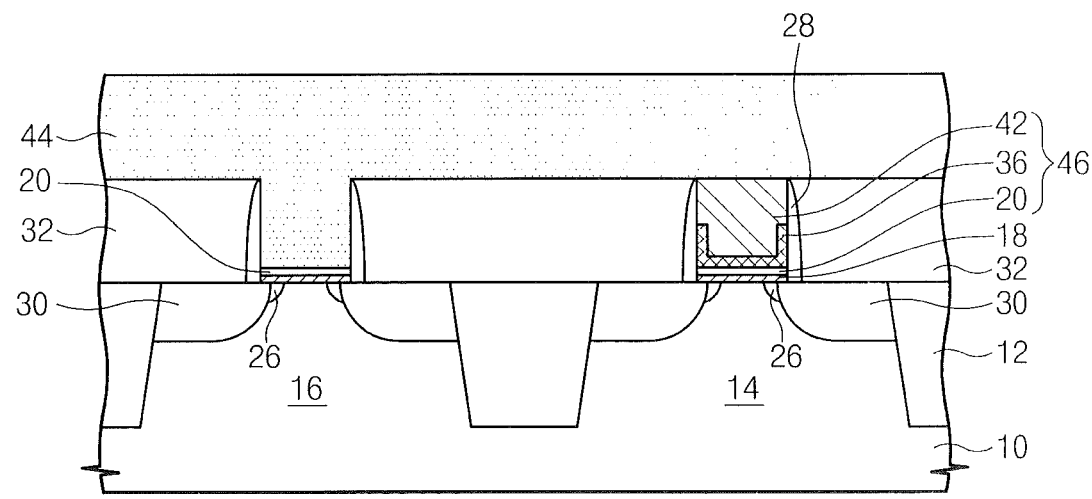

Referring to FIG. 36, a third metal layer 44 is formed in the third trench 43. The third metal layer 43 may be formed on the entire surface of the substrate 10. The third metal layer 43 may comprise at least one of aluminum, tungsten, titanium and tantalum which are formed by PVD or CVD. The third metal layer 44 may be formed of the same material as the second metal layer 42. The third metal layer 44 may be in contact with the buffer gate electrode 20 or the gate insulating layer 18.

Figure 37:
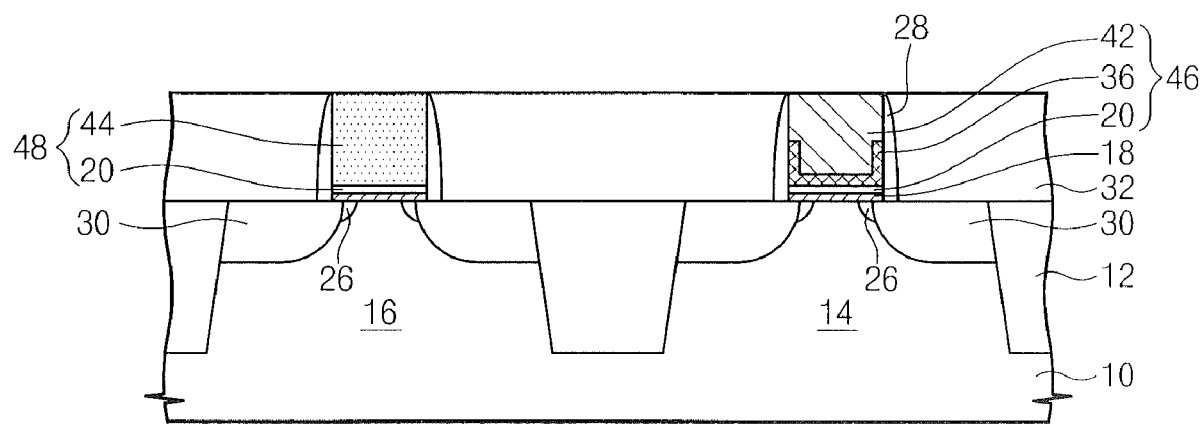

Referring to FIG. 37, the third metal layer 44 on the mold insulating layer 32 is removed to be planarized. The planarization of the third metal layer 44 may be performed by CMP or etch-back. The second gate electrode 48 may comprise the buffer gate electrode 20 and the third metal layer 44. The second gate electrode 48 may compose an n-MOS transistor on the second active region 16. The n-MOS transistor is different from the p-MOS transistor in the operation voltage. Current in the n-MOS transistor may be controlled in accordance with a switching voltage. Thus, the second gate electrode 48 may comprise less than two metal layers in order to simplify the estimation of an electric resistance or a work function according to combination of the metal layers. For example, the operating voltage may be applied lower to the first gate electrode 46 of the p-MOS transistor than to the second gate electrode the n-MOS transistor. In conventional device, the first gate electrode 46 is weak in a void defect. According to the second embodiment, however, the first gate electrode 46 does not have a void to prevent operation characteristic of the p-MOS transistor from deterioration. In the second embodiment of the inventive concept, the first gate electrode 46 is formed on the first active region before forming the second gate electrode 48 on the second active region. The second gate electrode 48 may be extended on the second active region 16 in a direction. The second gate electrode 48 may be extended vertically to the direction in which the source/drain regions 30 are arranged.

Although not shown in drawings, the mold insulating layer 32 on the source/drain region 30 may be removed to form a contact hole, and a source/drain electrode may be formed in the contact hole.

According to embodiments of the inventive concept, the first gate electrode comprising the first metal and the second metal can be formed on the first active region, and the second gate electrode comprising the second metal can be formed on the second active region. Therefore, the first gate electrode and the second gate electrode can be formed of different metals from each other.

Further, the first metal layer is removed at the beginning of the trench in which the first gate electrode is formed, and the second metal layer is formed on the first metal layer. Therefore, the second metal layer can be formed without overhangs.

Further more, the second metal layers of the first gate electrode and the second gate electrode are formed simultaneously such that the manufacturing process can be reduced, and thereby productivity can be increased or maximized.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of forming an insulated-gate transistor, comprising:
    forming a gate insulating layer on a substrate;
    forming a metal buffer gate electrode layer on the gate insulating layer;
    forming a dummy gate electrode layer on the buffer gate electrode layer, said dummy gate electrode layer and said buffer gate electrode layer comprising different materials;

patterning the dummy gate electrode layer and the buffer gate electrode layer in sequence to define a buffer gate electrode on the gate insulating layer and a dummy gate electrode on the buffer gate electrode;

forming electrically insulating spacers on sidewalls of the dummy gate electrode and on sidewalls of the buffer gate electrode;

covering the spacers and the dummy gate electrode with an electrically insulating mold layer;

removing an upper portion of the mold layer to expose an upper surface of the dummy gate electrode;

removing the dummy gate electrode from between the spacers by selectively etching back the dummy gate electrode using the mold layer and the spacers as an etching mask;

depositing a first metal layer onto an upper surface of the mold layer and onto inner sidewalls of the spacers and onto an upper surface of the buffer gate electrode;

filling a space between the inner sidewalls of the spacers by depositing a second metal layer onto a portion of the first metal layer extending between the inner sidewalls of the spacers to thereby define a metal gate electrode comprising a composite of the second metal layer, a portion of the first metal layer having a U-shaped cross-section and the buffer gate electrode.

2. The method of claim 1, wherein the second metal layer comprises aluminum, the first metal layer comprises titanium nitride and the buffer gate electrode comprises titanium nitride.

3. The method of claim 1, wherein the insulated-gate transistor is a PMOS transistor; and wherein the gate insulating layer comprises hafnium oxide.

4. The method of claim 1, wherein the dummy gate electrode comprises polysilicon.

5. The method of claim 1, wherein the buffer gate electrode comprises titanium nitride or tantalum nitride.

6. A method of forming an integrated circuit device, comprising:

forming a gate insulating layer on a substrate;

forming a first metal gate electrode layer on the gate insulating layer;

forming a dummy gate electrode layer on the first metal gate electrode layer, said dummy gate electrode layer and said first metal gate electrode layer comprising different materials;

patterning the dummy gate electrode layer and the first metal gate electrode layer in sequence to define a dummy gate electrode on the patterned first metal gate electrode layer;

forming electrically insulating spacers on sidewalls of the dummy gate electrode and on sidewalls of the patterned first metal gate electrode layer;

removing the dummy gate electrode from between the spacers by selectively etching back the dummy gate electrode using the spacers as an etching mask;

depositing a second metal gate electrode layer onto inner sidewalls of the spacers and onto an upper surface of the patterned first metal gate electrode layer;

depositing a third metal gate electrode layer onto the second metal gate electrode layer to thereby fill a space between the inner sidewalls of the spacers, said second and third metal gate electrode layers comprising different materials;

planarizing the third metal gate electrode layer and the second metal gate electrode layer to thereby define a composite metal gate electrode of a PMOS transistor between the inner sidewalls of the spacers, said composite metal gate electrode comprising a portion of the third metal gate electrode layer, a portion of the second metal gate electrode layer having a U-shaped cross-section and the patterned first metal gate electrode layer.

7. The method of claim 6, wherein said planarizing comprises planarizing the third metal gate electrode layer and the second metal gate electrode layer in sequence to reveal the portion of the second metal gate electrode layer having a U-shaped cross-section.

8. The method of claim 6, wherein said removing the dummy gate electrode is preceded by:

covering the spacers and the dummy gate electrode with an electrically insulating mold layer; and removing an upper portion of the mold layer to expose an upper surface of the dummy gate electrode.

9. The method of claim 8, wherein said depositing the third metal gate electrode layer is preceded by:

filling a space between the inner sidewalls of the spacers with a dummy filler layer that contacts the second metal gate electrode layer;

removing an upper portion of the second metal gate electrode layer from between the inner sidewalls of the spacers and the dummy filler layer to define a second metal gate electrode layer having a U-shaped cross-section; and removing the dummy filler layer to expose the second metal gate electrode layer.

10. The method of claim 6, wherein said patterning the dummy gate electrode layer and the first metal gate electrode layer comprises patterning the dummy gate electrode layer and the first metal gate electrode layer in sequence to define a second dummy gate electrode on the patterned first metal gate electrode layer; and wherein said forming electrically insulating spacers on sidewalls of the dummy gate electrode is followed by replacing the second dummy gate electrode with an upper metal gate electrode of an NMOS transistor.

11. The method of claim 10, wherein the gate insulating layer comprises a dielectric material selected from a group consisting of hafnium oxide and tantalum oxide; and wherein a gate electrode of the NMOS transistor comprises the upper metal gate electrode and a portion of the patterned first metal gate electrode layer.

12. The method of claim 11, wherein the portion of third metal gate electrode layer of the PMOS transistor and the upper metal gate electrode of the NMOS transistor comprise different metals.

13. The method of claim 12, wherein the portion of third metal gate electrode layer of the PMOS transistor comprises titanium nitride and the upper metal gate electrode of the NMOS transistor comprises aluminum.

14. The method of claim 12, wherein the gate electrode of the NMOS transistor comprises a composite of aluminum and titanium nitride.

15. The method of claim 6, wherein the gate insulating layer comprises a dielectric material selected from a group consisting of hafnium oxide and tantalum oxide.

* * * * *